United States Patent [19]

Graham et al.

[11] Patent Number: 4,910,418

[45] Date of Patent: Mar. 20, 1990

[54] SEMICONDUCTOR FUSE PROGRAMMABLE ARRAY STRUCTURE

[75] Inventors: Andrew C. Graham, Sunnyvale; Gary R. Gouldsberry, Cupertino; Mark E. Fitzpatrick, San Jose, all of Calif.

[73] Assignee: Gazelle Microcircuits, Inc., Santa Clara, Calif.

[21] Appl. No.: 291,906

[22] Filed: Dec. 29, 1988

[51] Int. Cl.⁴ ............................................. H03K 19/77
[52] U.S. Cl. .................... 307/465; 307/202.1; 307/468; 307/303.1; 340/825.84; 365/96
[58] Field of Search ............... 307/202.1, 448, 450, 307/465, 468, 469, 303.1; 340/825.84; 364/716; 365/96

[56] References Cited

U.S. PATENT DOCUMENTS

| | | | |
|---|---|---|---|
| 3,792,319 | 2/1974 | Tsang | 340/825.84 X |
| 4,207,556 | 6/1980 | Sugiyama et al. | 364/716 X |
| 4,455,495 | 6/1984 | Masuhara et al. | 307/465 X |
| 4,658,253 | 4/1987 | Johnson | 307/465 X |
| 4,758,745 | 7/1988 | Elgamal et al. | 307/468 X |
| 4,771,285 | 9/1988 | Agrawal et al. | 340/825.84 X |
| 4,799,089 | 1/1989 | Fukuma et al. | 357/45 |
| 4,833,518 | 5/1989 | Matsuda et al. | 357/45 |
| 4,847,810 | 7/1989 | Tagami | 307/202.1 X |

FOREIGN PATENT DOCUMENTS 3619530 10/1987 Fed. Rep. of Germany ... 307/202.1

Primary Examiner—David Hudspeth
Attorney, Agent, or Firm—Skjerven, Morrill, MacPherson, Franklin & Friel

[57] ABSTRACT

A programmable array including FET devices arranged in rows and columns is disclosed in which first and second bit lines for cells in adjacent first and second columns are arranged so that a fusible link connecting a cell of a column to its associated bit line crosses the bit line associated with the adjacent column of cells. By doing so, two fuses may now be located in an area which was heretofore occupied by a single fuse.

12 Claims, 3 Drawing Sheets

SEMICONDUCTOR FUSE PROGRAMMABLE ARRAY STRUCTURE

BACKGROUND OF THE INVENTION

1. Field of the Invention

This invention relates generally to semiconductor-based programmable memory arrays and more particularly to an improved fuse structural layout to provide increased array density.

2. Description of Prior Art

In the prior art, fuse programmable arrays of the type including rows and columns of semiconductor cells, such as could be used for Programmable Logic Devices (PLDs) or Programmable Read Only Memories (PROMs), were laid out rather conservatively in terms of semiconductor wafer space to provide easily programmable cells by ensuring that there was adequate spacing around fuses to permit easy severing of those fuses. This arises because of the typical 6 micron laser spot size and due to the typical 1-2 micron positioning tolerance available with commercially available laser systems. FIG. 1 is a top plan view of a portion of a typical prior art fuse programmable array 1. This structure is illustrated in commonly owned U.S. patent application Ser. No. 07/051,971, filed May 19, 1987, entitled "Laser Programmable Memory Array." FIG. 1 illustrates the layout of two columns of cells and their associated word lines, bit lines, power lines and fuses. As illustrated in FIG. 1, cell 2, indicated within the dashed line area, forms a first programmable cell comprising a compound semiconductor device and adjacent to cell 2 is illustrated, cell 3, indicated within dashed line 3. The cells in fuse programmable array 1 are served by bit lines, word lines, and power lines, and more particularly with respect to cell 2, bit line 4 which is connected to source region 5 via fuse 6. Word line 7 is connected to gate 8 of cell 2 and power line 9 is connected to drain region 10. As is well known to those skilled in the art, cell 2 is programmed by opening fuse 6 to sever the connection between bit line 4 and source region 5 or in the alternative, retaining the connection between bit line 4 and source region 5. In similar fashion, cell 3 is served by an associated bit line 11 which is coupled to source region 12 via programmable fuse 13. Also, cell 3 includes gate 13 which is connected to said word line 7, and drain region 14 which is connected to power line 15. In a typical prior art array such as that illustrated in FIG. 1, a conservative approach was taken in the layout to provide sufficient room around the fusable links, such as 6 and 13, to enable the easy programming of said links by laser beam application. As will be noted by reference to FIG. 1, there is wasted space around each fusable link since the area required for the cells is partially determined by the width of the FET in the cell. This provides more space around each link than is necessary for laser beam considerations. Thus it is desirable to provide a more sense array design to permit the production of arrays having more cells per unit area. As noted above, it will be appreciated that a substantial amount of unused substrate area is found around each fusible link, which area could better be used for the inclusion of additional cells.

SUMMARY OF THE INVENTION

It is an object of the present invention to provide a programmable array having a higher density than previously available by prior art designs by arranging first and second bit lines for cells in adjacent first and second columns so that a fusible link connecting a cell of a column to its associated bit line crosses the bit line associated with the adjacent column of cells. By doing so, two fuses may now be located in an area which was heretofore occupied by a single fuse.

In accordance with one embodiment of the invention, a programmable array is provided having a plurality of cells arranged in columns, with the cells in the columns being selective by connectable to a bit line associated with a corresponding column, the array comprising a first column of cells; a second column of cells adjacent to the first column of cells; a first bit line associated with the first column of cells and positioned between the first and second columns of cells; a second bit line associated with the second column of cells, the second bit line being positioned between the first column of cells and the fist bit line; first fuses associated with cells in the first column of cells for providing severable electrical connection between those cells and the first bit line, said first fuses crossing and being insulated from said second bit line; and second fuses associated with cells in the second column of cells for providing severable electrical connection between those cells and the second bit lines, said second fuses crossing and being insulated from said first bit line.

In accordance with yet another feature of the invention, the severable links associated with these cells are positioned between the first and second bit lines.

As an additional feature of the present invention, the severable links for the first column of cells and the severable links for the second column of cells are aligned with each other in a column.

BRIEF DESCRIPTION OF THE DRAWINGS

Other objects and advantages of the invention will become apparent from a study of the specification and drawings in which.

DETAILED DESCRIPTION OF THE INVENTION

Figure 2:
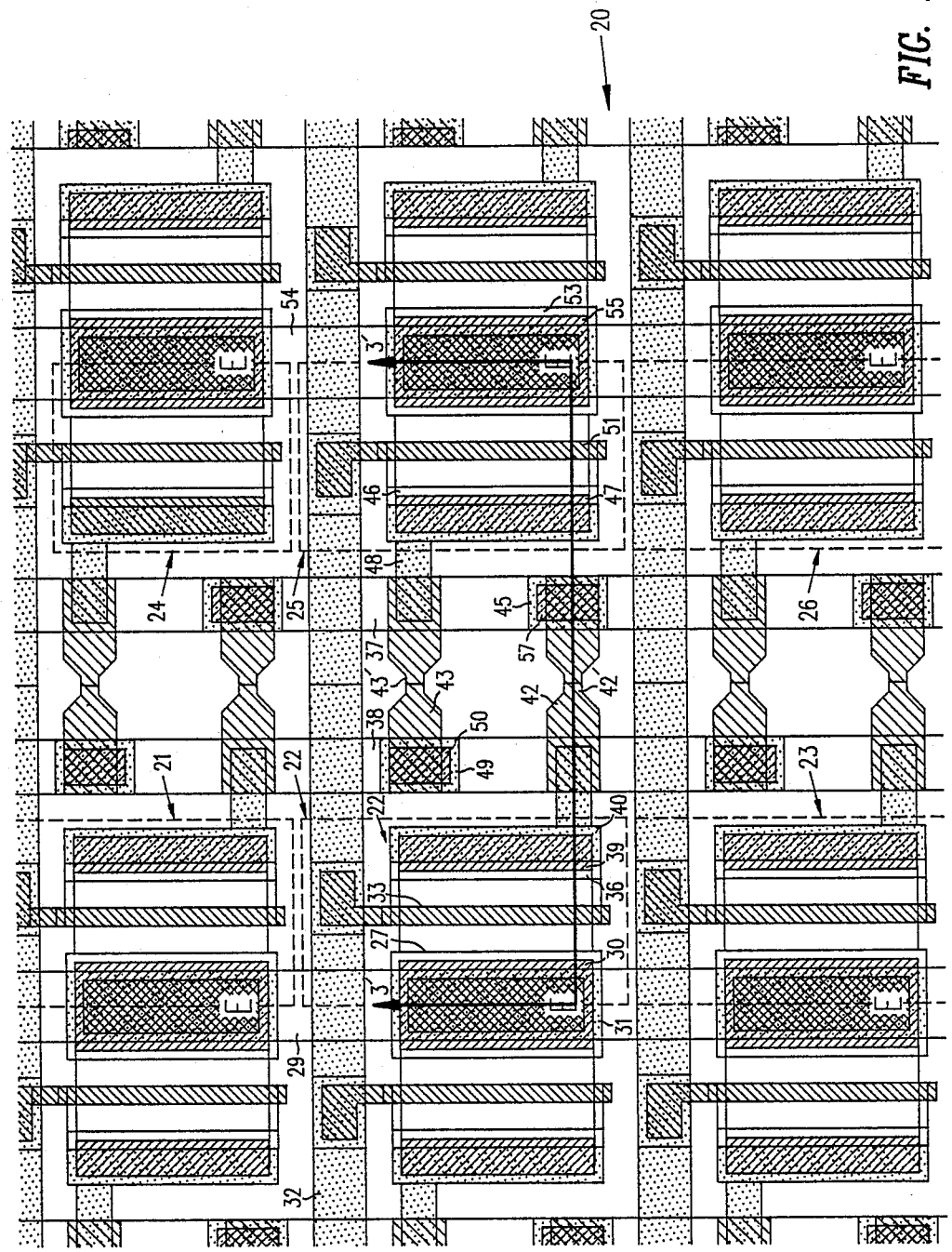
FIG. 2 is a top plan view of a portion of a programmable array made in accordance with the present invention.
Figure 3:
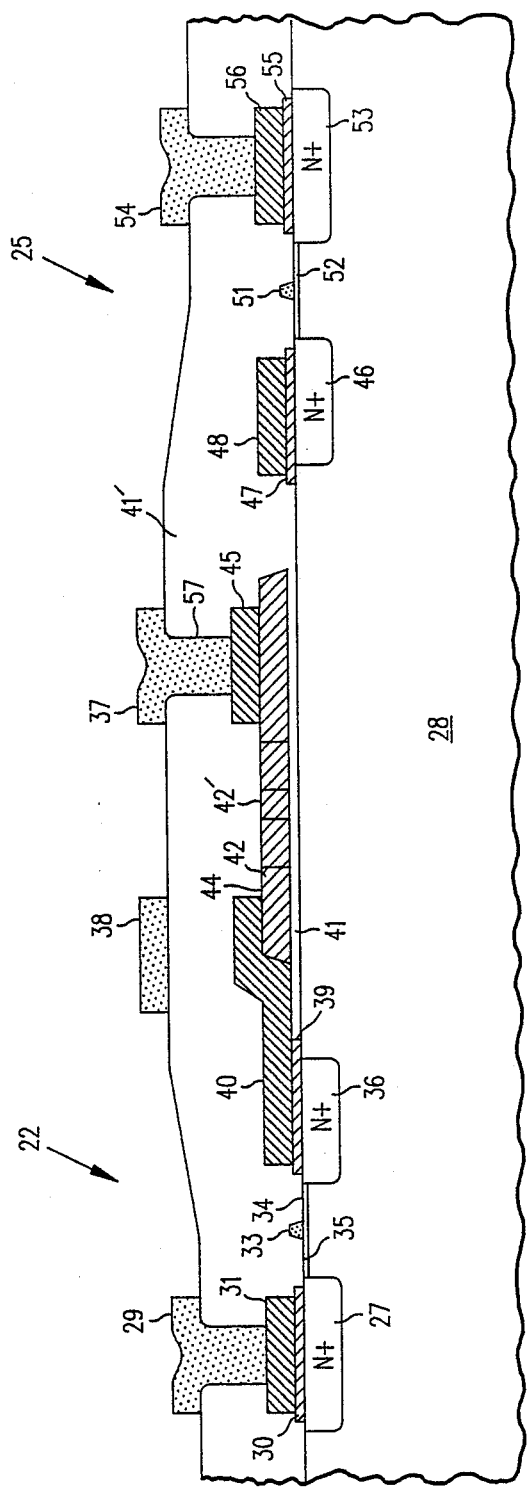
FIG. 3 is a sectional view taken along lines 3'—3' in FIG. 2.

Referring to FIG. 2, portion of programmable array 20 is illustrated in top plan view. It will be appreciated by reference to FIG. 2 that array 20 includes a first column of cells on the left hand side of the figure and a second column of cells on the right hand side, with the first column of cells including cells 21, 22, and 23. The second column of cells (on the right hand side of FIG. 2) includes cells 24, 25 and 26. The cells in the first column, as well as the cells of the second column, are substantially the same and for explanation purposes the details of only cells 22 and 25 will be hereinafter described. Reference to FIG. 3 in addition to FIG. 2 will assist in understanding the detailed construction of the invention, with FIG. 3 illustrating a cross section taken along the lines 3'—3' in FIG. 2. It will first be appreciated with reference to FIG. 2 that the cells are more densely packed than those indicated in prior art array 1, and this increased packing density is achieved through the unique arrangement of the cells, fusable links and their associated bit lines.

Figure 1:
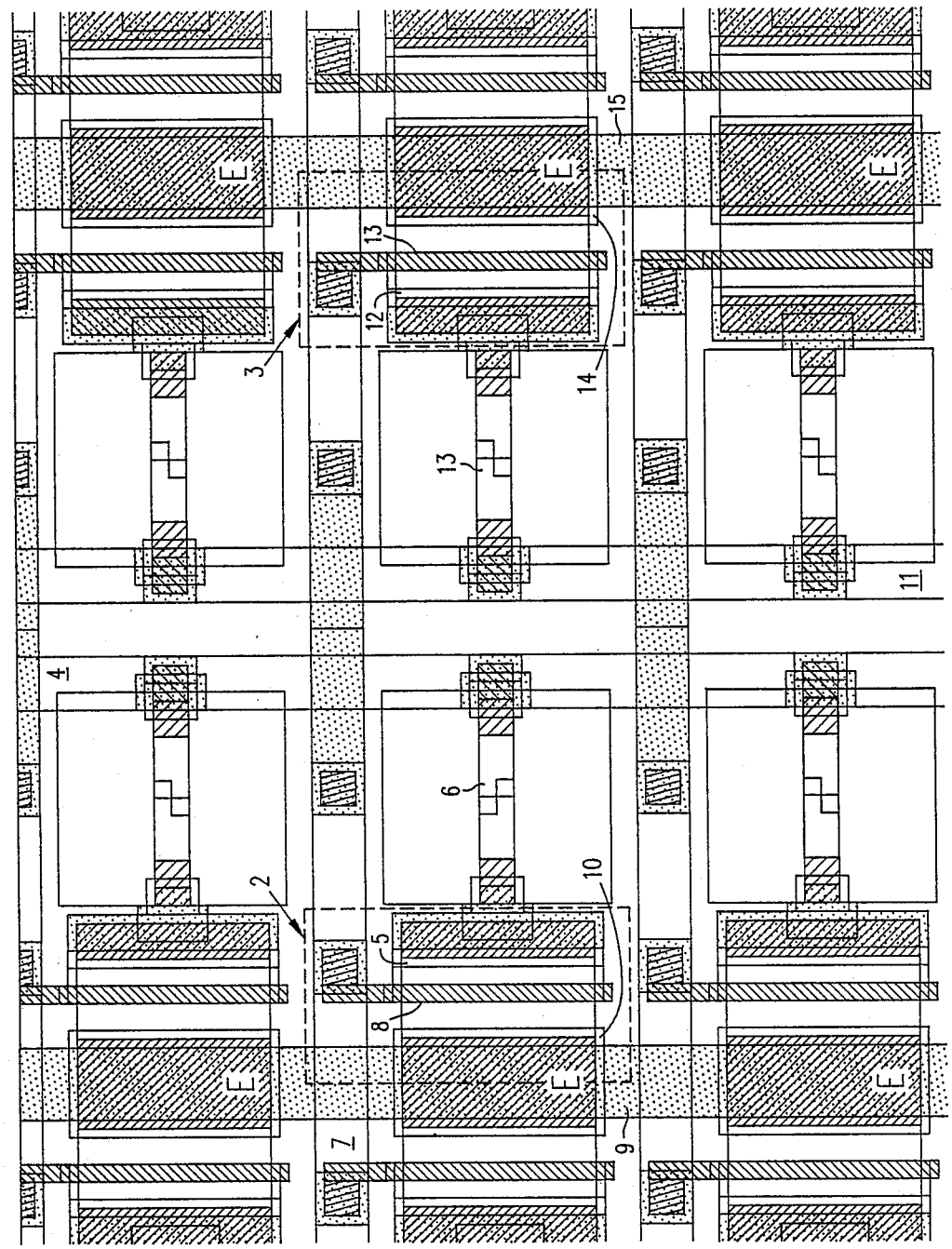
FIG. 1 is a top plan view of a portion of a prior art programmable array.

Referring particularly to cell 22 in the first column of cells, which includes cells 21, 22 and 23, cell 22 includes highly N-doped drain region 2 formed in semiconductor body 28, which may be, for example, GaAs (FIG. 3). Drain region 27 is connected to power line 29, which may be formed of, for example, a second layer of gold metallization, via ohmic contact 30 to drain region 27 and portion 31 of a first metal layer, which as will be appreciated further hereinafter is utilized for other connections in the device as well. Word line 32 serves cells 22 and 25, as well as other cells in the same row as cells 22 and 25. Word line 32 is coupled to gate 33 which is formed on surface 34 of body 28. As illustrated in FIG. 3, gate 33 is positioned above channel implant region 35 which extends between drain 27 and source region 36 of highly N-doped material. Cells 21, 22 and 23 (in the first column) are served by bit line 37. Cells 24, 25 and 26 (in the second column) are served by bit line 38. It will be appreciated by comparing the prior art array 1 in FIG. 1 with array 20 of the present invention that the bit lines in array 20 are not located immediately adjacent the column of cells which they serve, but are overlapped, that is, arranged such that the bit line for the second column is located between the bit line for the first column and the cells in the first column. By so doing, area on the array 20 is more efficiently used, thus permitting a higher density of cells per unit area.

Source region 36 of cell 22 is connected to bit line 37 via ohmic conducting portion 39 formed on surface 34 which contacts source region 36, portion 40 of first layer metal which is formed partially on ohmic conductor 39 and dielectric material 41, which may be, for example, silicon nitride. Prior to formation of first metal portion 40, fuse layer 42 is formed and patterned on dielectric 41 to provide the configuration which includes fuse link portion 42' having a reduced width. Fuse layer 42 is preferably comprised of nichrome. It will of course be appreciated that fuse portion 42 of cell 22, as well as the other fuse portions, such as fuse portion 43 and fuse link portion 43' associated with cell 25, are formed on dielectric layer 41 by providing a suitable layer of fuse material and patterning to provide the configuration illustrated.

Continuing with the description of the connection between source region 36 and bit line 37, this connection is accomplished through portion 40 of first layer metal which extends to the left hand edge of fuse 42 and contacts a portion of upper surface 44 of fuse portion 42. The connection between fuse portion 42 and bit line 37 is completed by first layer metal portion 45. As best illustrated in FIG. 3, bit line 37 extends through contact opening 57 in dielectric layer 41' to make contact with first layer metal portion 45.

It will be appreciated by reference to FIGS. 2 and 3 that the connection between source region 36 and bit line 37 extends beneath bit line 38 which serves cell 25. With this overlapping arrangement space is saved without sacrificing array performance. Although not illustrated in FIG. 3, the connection between bit line 38 and source region 46 of cell 25 is accomplished in the same manner as used to connect source region 36 of cell 22 to the associated bit line 37. More particularly, ohmic contact portion 47 is formed on surface 34 of body 28 and extends over a portion of the upper surface of source region 46. First layer metal portion 48 is formed on the surface of ohmic contact portion 47 and, as can best be seen in FIG. 2 to connect source region 46 to one end of fuse portion 43. It will also be appreciated by reference to FIG. 2 that first layer metal portion 48 extends beneath bit line 37 and contacts the right hand edge of fuse portion 43, fuse portion 43 extending to the left as seen in FIG. 2 and via first layer metal portion 49 (illustrated in FIG. 2) and contact window 50 (also illustrated only in FIG. 2) contact is made to bit line 38. It will also be noted that fuse portion 43 includes fuse link portion 43' having a reduced width. During programming, the fuse link portions, 42' and 43' for example, may be opened by laser techniques or the array may be programmed in the field by passing a sufficiently high current through the link portions to open the path between the bit line and its associated cell.

Cell 25 further includes gate 51 formed on surface 34 of body 28 and as will be appreciated by reference to FIG. 2, gate 51 extends across cell 25 and is connected to word line 32. In similar fashion to cell 22, cell 25 includes channel implant region 52 which extends between source region 46 and drain region 53. Drain region 53 is coupled to power line 54 (which also serves the other cells in the same column as cells 24, 25 and 26). The connection between power line 54 and drain region 53 is accomplished through ohmic contact portion 55 and first layer metal portion 56.

Programming of the cells in array 20 is accomplished by focusing a laser beam on the the narrowed fuse portion, denoted the fuse link portion, associated with the cell for which the connection between its associated bit line and source region are desired to be opened, and through heat generated by impact of the laser beam on the fuse link portion, the connection between the bit line and its associated cell is severed. Referring to FIG. 2, it will be appreciate that the fuse link portions for adjacent cells, for example fuse link portions 42' and 43' for cells 22 and 25 respectively, are positioned between the bit lines serving those cells. Also, for ease of manufacturing, the fuselink portions are aligned in columns. It will of course be appreciated that the present invention is not limited to the manner in which the connection is opened and this may be achieved with means other than laser beam application.

Additionally, while the present embodiment illustrates a fuse layer constructed below the first metal layer, the present invention includes other schemes for stacking of layers which might allow, for instance, the fuse layer to be above the first or even the second layer of metal interconnect. Although the embodiment described with respect to FIGS. 2 and 3 is preferred in light of our particular manufacturing process, forming the fuse layer above the metal layers would likely require less laser power to sever the fuse link due to less overlying dielectric material.

Similarly, the present invention is not restricted to arrays in which the cells are FET devices. For example, bipolar transistors may be utilized as the active cells or other active cells such as with silicon semiconductors may be utilized. Although the severable electrical connection means between the cells in array 20 are illustrated as fuse portion 42 and fuse portion 43 for cells 22 and 25 respectively, other types of severable electrical connection means can be utilized.

We claim:

1. A programmable array having a plurality of cells arranged in columns, with said cells in said columns being selectively connectable to a conductor associated with a corresponding column, said array comprising:
- a first column of cells;
- a second column of cells adjacent to said first column of cells;
- a first conductor associated with said first column of cells and positioned between said first and second columns of cells;
- a second conductor associated with said second column of cells, said second conductor being positioned between said first column of cells and said first conductor;
- means associated with cells in said first column of cells for providing severable electrical connection between said cells and said first conductor; and
- means associated with cells in said second column of cells for providing severable electrical connection between said cells and said second conductor.

2. An array as set forth in claim 1, wherein said means for providing severable electrical connection between cells in said first column and said first conductor includes a severable link associated with each of said cells in said first column with said severable links being positioned between said first and second conductors, and said means for providing severable electrical connection between cells in said second column and said second conductor includes a severable link associated with each of said cells in said second column with said severable links for said second column of cells being positioned between said first and second conductors.

3. An array as set forth in claim 2, wherein said severable links for said first column of cells and said severable links for said second column of cells are aligned with each other in a column.

4. An array as set forth in any of claims 1, 2, or 3, wherein said means for providing severable electrical connection between said cells and their associated conductors comprises a laser fusable material.

5. An array as set forth in claim 4, wherein said cells are comprised of GaAs MESFET devices.

6. An array as set forth in any of claims 1, 2, or 3, wherein said means for providing severable electrical connection between said cells and their associated conductors comprises a material which is severable in response to the application of an electrical current or voltage.

7. An array as set forth in claim 6, wherein said cells are comprised of GaAs MESFET devices.

8. An array as set forth in any of claims 1, 2 or 3, wherein said columns of cells are vertically oriented and cells in said first and second columns are horizontally aligned, an wherein said means for providing severable electrical connection between the cells in said first column and said first conductor and said means for providing severable electrical connection between said cells in said second column and said second conductor include severable links located between their associated columns of cells and within their associated row of cells.

9. An array as set forth in claim 8, wherein said severable links are comprised of a laser fusable material.

10. An array as set forth in claim 9, wherein said cells are comprised of GaAs MESFET devices.

11. An array as set forth in claim 8, wherein said severable links are comprised of a material which is severable in response to the application of an electrical current or voltage.

12. An array as set forth in claim 11, wherein said cells are comprised of GaAs MESFET devices.

* * * * *

UNITED STATES PATENT AND TRADEMARK OFFICE
CERTIFICATE OF CORRECTION

PATENT NO. : 4,910,418

DATED : March 20, 1990

INVENTOR(S) : Andrew C. Graham, et al.

It is certified that error appears in the above-identified patent and that said Letters Patent is hereby corrected as shown below:

Col. 3, line 5, "region 2" should read --region 27--.

Col. 6, line 18, "an" should read --and--.

Signed and Sealed this

Thirty-first Day of December, 1991

Attest:

HARRY F. MANBECK, JR.

*Attesting Officer*   Commissioner of Patents and Trademarks